United States Patent
Ditzel et al.

(10) Patent No.: US 9,941,197 B2
(45) Date of Patent: Apr. 10, 2018

(54) STRIP-SHAPED SUBSTRATE FOR PRODUCING CHIP CARRIERS, ELECTRONIC MODULE WITH A CHIP CARRIER OF THIS TYPE, ELECTRONIC DEVICE WITH A MODULE OF THIS TYPE, AND METHOD FOR PRODUCING A SUBSTRATE

(71) Applicant: Heraeus Deutschland GmbH & Co. KG, Hanau (DE)

(72) Inventors: Eckhard Ditzel, Linsengericht (DE); Siegfried Walter, Gelnhausen (DE); Michael Benedikt, Neuberg (DE); Udo Becker, Steinau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 15/322,171

(22) PCT Filed: Jun. 15, 2015

(86) PCT No.: PCT/EP2015/063257
§ 371 (c)(1),
(2) Date: Dec. 26, 2016

(87) PCT Pub. No.: WO2015/197386
PCT Pub. Date: Dec. 30, 2015

(65) Prior Publication Data
US 2017/0133313 A1 May 11, 2017

(30) Foreign Application Priority Data
Jun. 25, 2014 (DE) .................. 10 2014 108 916

(51) Int. Cl.
*H01L 23/495* (2006.01)
*H01L 23/498* (2006.01)
(Continued)

(52) U.S. Cl.
CPC ........ *H01L 23/49855* (2013.01); *G06K 19/07* (2013.01); *G06K 19/07749* (2013.01);
(Continued)

(58) Field of Classification Search
CPC ............. H01L 21/4842; H01L 23/3132; H01L 23/49503; H01L 23/49548;
(Continued)

(56) References Cited

U.S. PATENT DOCUMENTS 2,522,783 A    10/1993   Baird
5,252,783 A * 10/1993   Baird .................... H01L 21/565
                                                                                                        174/528
(Continued)

FOREIGN PATENT DOCUMENTS

DE    10 2011 113 269 A1    4/2012
DE    20 2012 100 694 U    5/2012
(Continued)

OTHER PUBLICATIONS

Office Action dated Aug. 27, 2014 issued by the German patent office (DPMA) in German application DE 10 2014 108 916.2; machine translation of selected portions provided.
(Continued)

*Primary Examiner* — Luan C Thai
(74) *Attorney, Agent, or Firm* — Hassan Abbas Shakir; Katten Muchin Rosenman LLP

(57) ABSTRACT

A strip-shaped substrate made from a film includes a plurality of units for producing chip carriers. Each unit has a chip island for fixing a semiconductor chip, electrodes for electrical connection of the semiconductor chip, and through-openings for structuring the unit. At least one through-opening forms an anchoring edge for a casting compound for encapsulating the semiconductor chip. A surface section of the film abutting the through-opening is (Continued)

chamfered to form the anchoring edge. The anchoring edge protrudes past the side of the film on which the chip island is arranged.

13 Claims, 6 Drawing Sheets

(51) Int. Cl.
| | | |
|---|---|---|
| *H01L 21/48* | (2006.01) | |
| *H01L 21/56* | (2006.01) | |
| *H01L 23/66* | (2006.01) | |
| *G06K 19/07* | (2006.01) | |
| *G06K 19/077* | (2006.01) | |
| *H01L 23/00* | (2006.01) | |
| *H01L 23/31* | (2006.01) | |

(52) U.S. Cl.
CPC ........ *H01L 21/4842* (2013.01); *H01L 21/561* (2013.01); *H01L 23/3121* (2013.01); *H01L 23/49503* (2013.01); *H01L 23/49548* (2013.01); *H01L 23/49551* (2013.01); *H01L 23/49582* (2013.01); *H01L 23/49861* (2013.01); *H01L 23/562* (2013.01); *H01L 23/66* (2013.01); *H01L 24/48* (2013.01); *H01L 23/3107* (2013.01); *H01L 23/49541* (2013.01); *H01L 2223/6611* (2013.01); *H01L 2223/6677* (2013.01); *H01L 2924/00014* (2013.01); *H01L 2924/013* (2013.01); *H01L 2924/1711* (2013.01); *H01L 2924/1776* (2013.01); *H01L 2924/17747* (2013.01); *H01L 2924/18301* (2013.01)

(58) Field of Classification Search
CPC ......... H01L 23/49551; H01L 23/49582; H01L 23/49855; H01L 23/562
USPC ........................................................ 257/667
See application file for complete search history.

(56) References Cited

U.S. PATENT DOCUMENTS

| | | | | |
|---|---|---|---|---|
| 5,594,234 | A | * | 1/1997 | Carter, Jr. ......... H01L 23/49503 257/666 |
| 6,329,706 | B1 | * | 12/2001 | Nam ................. H01L 23/49503 257/666 |
| 7,317,181 | B2 | * | 1/2008 | Murakami ............. H01L 24/97 250/214.1 |
| 7,968,998 | B1 | * | 6/2011 | Choi ................. H01L 23/49541 257/666 |
| 8,008,758 | B1 | * | 8/2011 | Kim .................... H01L 23/3128 257/666 |
| 2002/0163015 | A1 | | 11/2002 | Lee et al. |
| 2006/0054912 | A1 | | 3/2006 | Murakami et al. |
| 2012/0061819 | A1 | | 3/2012 | Siemieniec |

FOREIGN PATENT DOCUMENTS

| | | |
|---|---|---|
| EP | 0 712 160 A2 | 5/1996 |
| EP | 1 557 881 A1 | 7/2005 |
| JP | H06 61408 A | 3/1994 |

OTHER PUBLICATIONS

International Search Report dated Sep. 2, 2015 in application PCT/EP2015/063257, WIPO translation provided.
Written Opinion dated Dec. 30, 2015 in application PCT/EP2015/063257, WIPO translation provided.
English Translation of the International Preliminary Report on Patentability, dated Jan. 5, 2017.

\* cited by examiner

STRIP-SHAPED SUBSTRATE FOR PRODUCING CHIP CARRIERS, ELECTRONIC MODULE WITH A CHIP CARRIER OF THIS TYPE, ELECTRONIC DEVICE WITH A MODULE OF THIS TYPE, AND METHOD FOR PRODUCING A SUBSTRATE

BACKGROUND OF THE INVENTION

1. Field of the Invention

The invention is directed to a strip-shaped substrate made from a film comprising a number of units for producing chip carriers as well as an electronic module with such a chip carrier, an electronic device with a module of this type and a method for producing a substrate.

2. Discussion of the Related Art

A strip-shaped substrate from a film with a number of units for producing chip carriers has been disclosed, for example, in DE 20 2012 100 694 U1, which goes back to the applicant.

The chip carriers produced from the strip-shaped substrate are used for electronic modules such as RFID chips (radio frequency identification) for use in chip cards. RFID chip cards have memory chips, which can be read and written to in a contactless manner with the aid of an external RFID antenna with radio frequency identification and transponder for energy supply. Possible areas of application of such RFID chips are identity documents with biometric data (ID-card, passport), health cards, bank cards or public transport tickets.

RFID chips of this kind are produced by placing a plurality of semiconductor chips encapsulated respectively in a casting compound or moulding compound onto the strip-shaped substrate mentioned in the beginning. To this end the strip-shaped substrate mentioned in the beginning comprises a film with a number of units for producing chip carriers, wherein each unit comprises a chip island for fixing the semiconductor chip, electrodes for electrically connecting the semiconductor chip and through-openings for structuring the unit. The modules formed in this way, after being subjected to a functional test, are separated from the strip and integrated with the chip card.

Since the chip cards are flat, the modules, on the one hand, must not exceed an overall maximum thickness. On the other hand, the modules must be sufficiently stable in order to prevent the chips or chip carriers from becoming damaged which in consequence could negatively affect the function of the chip card.

Furthermore, in order to ensure perfect functioning of the chip card the casting compound encapsulating the chip needs to be well anchored. To this end the through-openings provided in the substrate form anchoring edges for the casting compound in which the semiconductor chips are to be encapsulated.

With the substrate known from DE 20 2012 100 694 U1 the anchoring edge is formed by a graduation, serving as an undercut. The undercut/graduation is produced by embossing the underside of the substrate. During encapsulation of the chip the undercut is filled with the casting compound, thereby achieving the desired anchoring effect. The prerequisite for a sufficient anchoring effect is a minimum film thickness, so that the undercut can be given a depth providing the free space required for receiving the casting compound. The minimum film thickness limits to minimum overall thickness of the electrical module, which for the known substrate can in practice not be reduced any further without negatively affecting the functional reliability of the chip carrier.

SUMMARY OF THE INVENTION

The invention is based on the requirement to propose a strip-shaped substrate for producing chip carriers, which makes it possible to reduce the overall thickness of the electrical modules produced from the chip carriers. A further requirement of the invention consists in proposing an electronic module with a chip carrier, an electronic device, in particular a chip card with such a module as well as a method for producing a substrate.

The invention is based on the idea to propose a strip-shaped substrate from a film with a number of units for producing chip carriers. One unit respectively comprises a chip island for fixing a semiconductor chip, electrodes for electrically connecting the semiconductor chip and through-openings for structuring the unit. At least one through-opening forms an anchoring edge for a casting compound for encapsulating the semiconductor chip. A surface section of the film abutting the through-opening is chamfered to form the anchoring edge. The anchoring edge protrudes past the side of the film on which the chip island is arranged.

Instead of the known undercut created by reducing the material thickness, according to the invention the anchoring edge is reshaped by bending, i.e. chamfered. The advantage of this is that the film thickness is not the limiting factor for producing the anchoring effect. Rather, due to the chamfering of the surface section abutting the through-opening a profiling of the film is produced which during encapsulation of the semiconductor chip provides the desired secure connection between the mould cap/the casting compound and the substrate, independently of the thickness of the substrate/the film.

Anchoring is accomplished in that the anchoring edge protrudes past the side of the film, on which the chip island is arranged. This leads to the anchoring edge being embedded in the casting compound during encapsulation of the semiconductor chip, thereby ensuring a secure mechanical connection between the substrate and the casting compound. The chamfered surface section has the further advantage that the chip carrier/generally areas of the chip carrier are mechanically stabilised.

Overall, the invention makes it possible to reduce the film thickness compared to the state of the art without in any way affecting the secure anchoring of the casting compound in the substrate as well as the stability of the chip carriers produced from the substrate.

The anchoring edge may simply be chamfered. In this case the chamfered surface section is shaped flat except for the bending edge. For example the chamfered surface section may have an L-profile. Other profiles are possible.

Preferably the thickness of the film may be between 15 µm and 35 µm. In a particularly preferable embodiment the film thickness may be approx. 20 µm. Based on the above-mentioned values and if using chip carriers produced from the substrate the overall thickness of the electrical module, which may also be called a package, may be reduced to approx. 200 µm.

In a particularly preferred embodiment of the invention the film is formed from steel, in particular from austenitic stainless steel. In contrast to the copper alloys normally used in the art, steel with high-tensile strength still comprises sufficient reshaping characteristics. Preferably the steel used is hard-rolled austenitic stainless steel. The term stainless steel, according to EN 10020 is understood to mean alloyed or unalloyed steel of very high purity, e.g. steel with a sulphur and phosphor content of max. 0.025%. The austenitic structure results in rust-resistant and acid-resistant steel, e.g. steel according to DIN 267 part 11. Alternatively the film may be produced from copper or a copper alloy. By contrast however, steel has the advantage that it has high-tensile strength with good reshaping characteristics.

In a further preferred embodiment the chamfer angle between the chamfered surface section and the further surface of the film is between 30° and 60°, in particular between 40° and 50°. In a particularly preferred embodiment the chamfer angle is approx. 45°. The chamfer angle in the above mentioned areas allows sufficient embedding of the anchoring edge in the casting compound, wherein the casting compound can flow underneath the chamfered surface section, totally enclosing it.

Conveniently the chamfered surface section is straight. This makes the film stable, or in other words, an introduction of undesirable mechanical stresses into the film is thereby avoided. The straight surface section extends in a straight line and parallel to the surface of the film.

At least one chamfered surface section may comprise a comb-like profile in order to reduce mechanical stresses. Additionally or alternatively at least one chamfered surface section may comprise a smooth outer edge.

The through-openings may comprise chamfer-free curvatures and/or chamfer-free recesses in order to reduce mechanical stresses. Surface sections abutting the curved areas of the through-openings are configured so as to extend flush with the further area of the film resulting in a chamfer-free arrangement. Manufacture of the substrate is thus simplified. Mechanical stresses in the material are reduced.

In order to stabilise the chip island, through-openings abutting the chip island, in particular on the inside, comprise anchoring edges. This not only leads to good mechanical stabilisation of the chip island, but also to an especially good anchoring of the casting compound in the immediate vicinity of the semiconductor chip.

The invention further leads to an electronic module with a chip carrier, which comprises a chip island and a semiconductor chip attached thereon, electrodes for electrically connecting the semiconductor chip, in particular by means of bond wires, and through-openings for structuring the chip carrier. At least one through-opening forms an anchoring edge for a casting compound which encapsulates the semiconductor chip. A surface section of the chip carrier abutting the through-opening is chamfered for forming the anchoring edge. The anchoring edge protrudes past the side of the chip carrier on which the chip island is arranged. The anchoring edge is embedded in the casting compound.

The module/package configured according to the invention is based on the same idea as the substrate according to the invention and comprises a chamfered surface section abutting the through-opening for forming the anchoring edge, which consequently protrudes past the side of the chip carrier on which the chip island is arranged. With the module the semiconductor chip is fitted onto the chip island and embedded in the casting compound. To ensure a good mechanical connection of the casting compound with the chip carrier, the anchoring edge is embedded into the casting compound. To this end provision is made according to the invention for the surface section forming the anchoring edge to be chamfered.

The electrical connection of the semiconductor chip may be effected by means other than bond wires.

The invention further relates to an electronic device, in particular a chip card, health card, bank card, public transport ticket, hotel card, paper-foil-type card such as an admission card or an identity document or passport with a module according to the invention.

In terms of the method according to the invention for producing a strip-like substrate with a number of chip carrier units, the units are structured by forming through-openings, respectively. Structuring may be effected e.g. by punching or cutting. A surface section of the respective unit abutting the through-opening is chamfered for forming the anchoring edge.

Normally a copper alloy is used in the art for producing the strip-like substrate. Surprisingly the invention shows that the use of a metal foil made of steel, in particular of austenitic steel with a thickness of 15 μm to 35 μm, leads to sufficient stability, in particular in a case where the anchoring edge is produced by chamfering the surface section abutting the respective through-opening.

BRIEF DESCRIPTION OF THE DRAWINGS

The invention will now be discussed in detail including further details, with reference to the attached schematic drawings by way of exemplary embodiments, in which.

Figure 1:
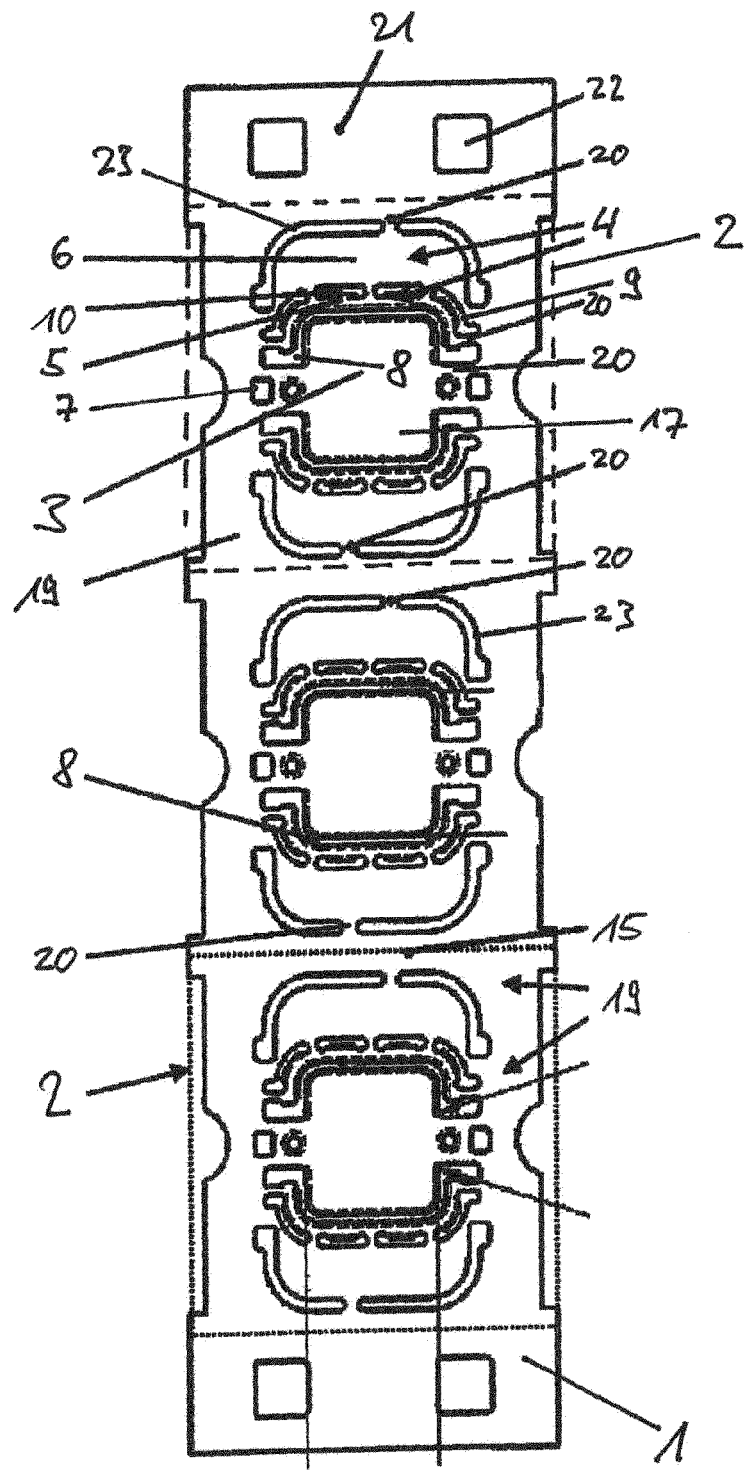
FIG. 1 shows a strip-shaped substrate with a number of units for producing chip carriers according to the state of the art.

The basic structure of the strip-shaped substrate shown in FIG. 1 may also be realised in terms of the invention. The invention is different from the substrate shown in FIG. 1 in that a.o. the anchoring edges are shaped in a different manner not shown in detail in FIG. 1.

DETAILED DESCRIPTION OF THE INVENTION

The invention is not limited to the basic structure shown in FIG. 1, in particular the structuring of the substrate. The invention also covers substrates, where the geometries are structured in a different way. For example further stress-relief slots may be provided in order to reduce mechanical stresses, which if arranged in the area of the moulding compound/casting compound, may be provided with anchoring edges formed according to the invention.

The strip-shaped substrate shown in FIG. 1 is an intermediate product which is further processed to create a package or electronic module. The anchoring edges introduced into the substrate are also present in the further-processed module or in the end product, such as in a chip card or generally in the electronic device.

In detail the strip-shaped substrate as per FIG. 1 is constructed as follows. The description which follows is explicitly disclosed in the context of the invention/in all exemplary embodiments of the application.

The strip-shaped substrate is produced from a flexible film 1. The flexible film 1 is preferably a steel foil, in particular a foil produced from hard-rolled, austenitic stainless steel. The film or foil comprises a number of units 2 which are separated from each other in a later method step for producing electronic modules. The units are all constructed identically. Each unit 2 has a chip island 3 to which the semiconductor chip can be attached.

The semiconductor chip may come in a variety of embodiments. These may be in the form of an electronic memory, random electronic circuits (integrated circuits—ICs) or LEDs.

In terms of the invention the strip-shaped substrate includes embodiments without and with semiconductor chips. In FIG. 1, as well as in FIG. 2, the substrate is shown in a fitted condition, i.e. fitted with semiconductor chips 17.

The substrate comprises more than the units 2 shown in FIG. 1. Normally the substrate extends in transverse direction to the depicted three units 2. The substrate is or may be coated.

Each unit 2 comprises electrodes 4 for electrical connection of the respective semiconductor chip 17. The electrodes 4 surround the chip islands 3 on both sides respectively. The chip islands are electrically neutral. Each electrode 4 is divided into two partial areas, i.e. into a bond pad 5/a bond connection surface 5, which is used to electrically contact the semiconductor chips with the aid of bond wires (not shown). Other electrical connections are possible. The second partial area of the respective electrode 4 is an outer contact surface, e.g. an antenna pad 6, to which an antenna (not shown) or a voltage supply (not shown) can be connected.

The strip-shaped substrate is provided with through-openings 7, 8, 9, 10, with the aid of which the respective unit 2 is structured and the above-mentioned functional areas of the unit 2 are delimited from each other.

First through-openings 7 are formed laterally of the chip island 3. The first through-openings 7 are essentially rectangular, in particular square. Other geometries are possible.

The unit 2 comprises second through-openings 8 which limit the chip island 3 and essentially determine its form and size. The second through-openings 8 are arranged mirror-symmetrically on both sides of the chip island 3. The second through-openings 8 are essentially shaped in the form of a "U". Each second through-opening 8 comprises a transverse shank, which is arranged transversely to the longitudinal direction of the unit 2 and which determines the width of the chip island. The two longitudinal shanks of the through-openings 8 arranged in longitudinal direction of the unit 2 are shorter than the longitudinal side of the chip island 3, so that the ends of the longitudinal shanks of the second through-openings 8 are spaced apart from each other.

The first through-openings 7 are arranged between the second through-openings 8.

Figure 2:
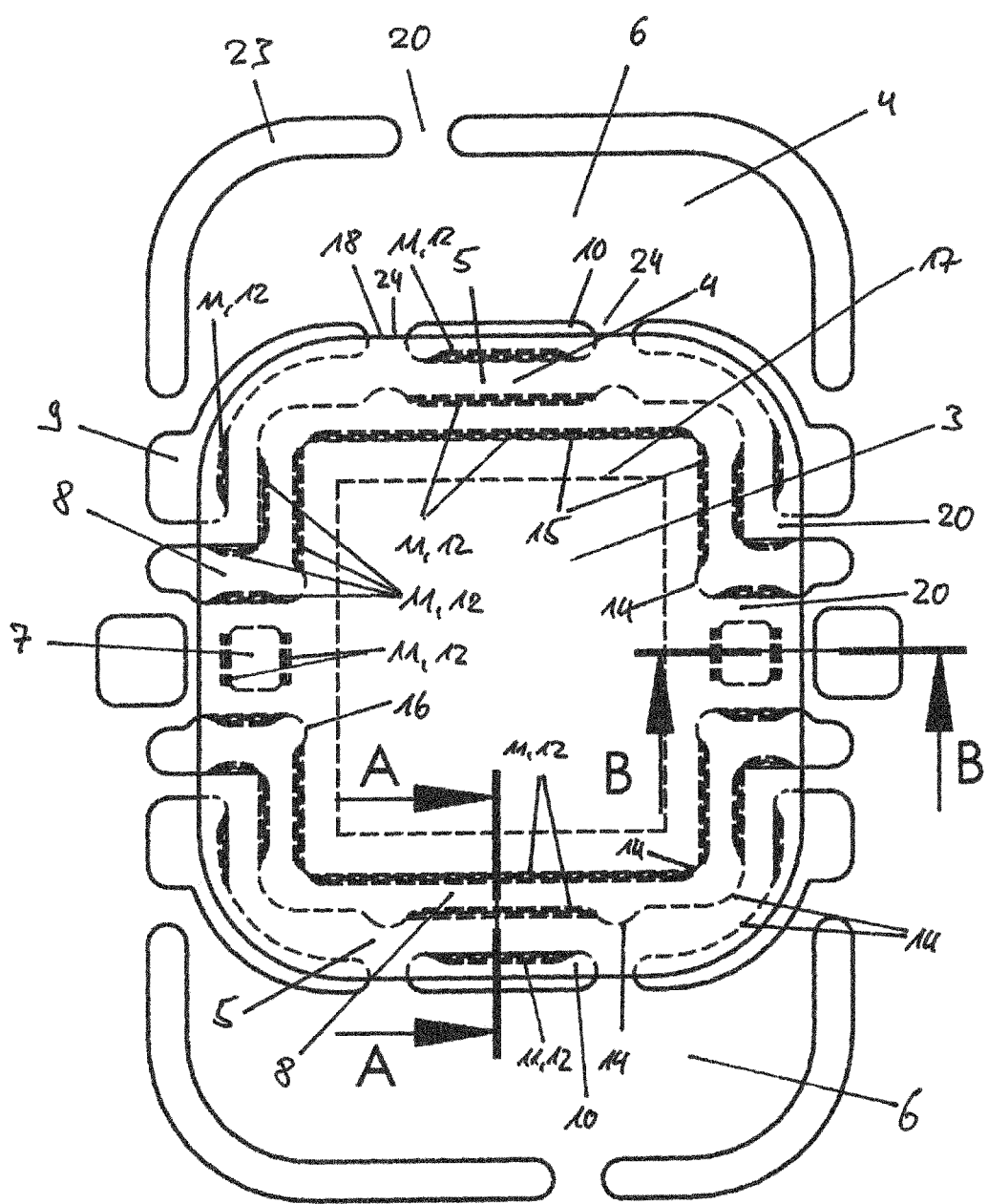
FIG. 2 shows a cut-out from a strip-shaped substrate according to an embodiment of the invention with anchoring edges configured according to the invention.

The substrate shown in FIG. 2 further comprises third and fourth through-openings 9, 10, which separate the bond pad from the antenna pad 6. Between the third and fourth through-openings 9, 10 connecting webs 24 are formed, which form the electrical connection of the bond pad 5 and the antenna pad 6.

The third through-openings 9 are curved in sections and extend in the area of the corners of the second through-openings 8.

The fourth through-openings 10 are arranged parallel to the transverse shank of the second through-opening 8. Instead of the single fourth through-opening 10 shown in FIG. 2 two through-openings 10 respectively may be provided on the respective side of the chip island 3, as shown for example in FIG. 1.

The unit 2 shown in FIG. 2 further comprises through-openings 23, which are arranged outside the casting compound and therefore do not comprise any anchoring edges. The through-openings 23 without anchoring edges delimit the antenna pads 6 from the remaining areas 19 of the foil shown in FIG. 1. A web 20 respectively is formed between the through-openings 23 which is removed prior to the function test and is used for handling the substrate during processing. The same applies to the webs 20 between the second and third through-openings 8, 9.

The remaining areas 19 of each unit surround the electrodes 4 as well as the chip island 3 and ensure the mechanical bond of the substrate during processing. The electrodes 4 and the chip islands 3 form part of the electronic modules produced from the substrate. The remaining areas 19 and the conveying strip 21 are removed during manufacture. The manufacturing process is described in detail in DE 20 2012 100 694 U1 in paragraphs [0078] to [0084] to which express reference is made at this point.

In order to protect and fix the semiconductor chip 17 this is embedded into a casting compound 18. The casting compound 18 surrounds the semiconductor chip 17 and the bond wires and extends at least partially over the electrode 4, in particular over the bond connection surface/the bond pad 5. In order to ensure reliable operation of the modules/the components produced therefrom, it is crucial that the casting compound 18/the mould cap formed therefrom is firmly connected to the strip-shaped substrate/the chip carrier after separation of the respective units 2.

Figure 3:
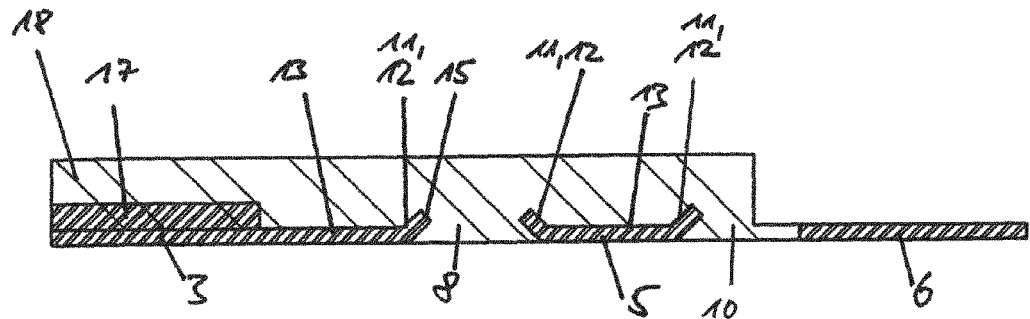
FIG. 3 shows a section through the substrate according to FIG. 2 along line A-A.
Figure 4:
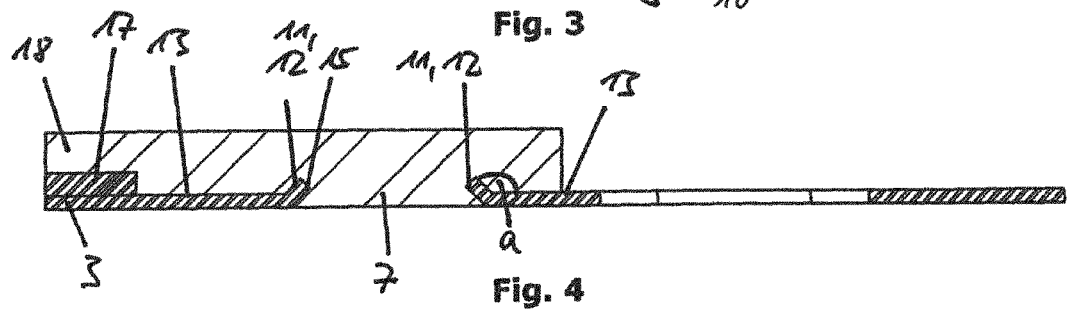
FIG. 4 shows a section through the substrate according to FIG. 2 along line B-B.
Figure 8:
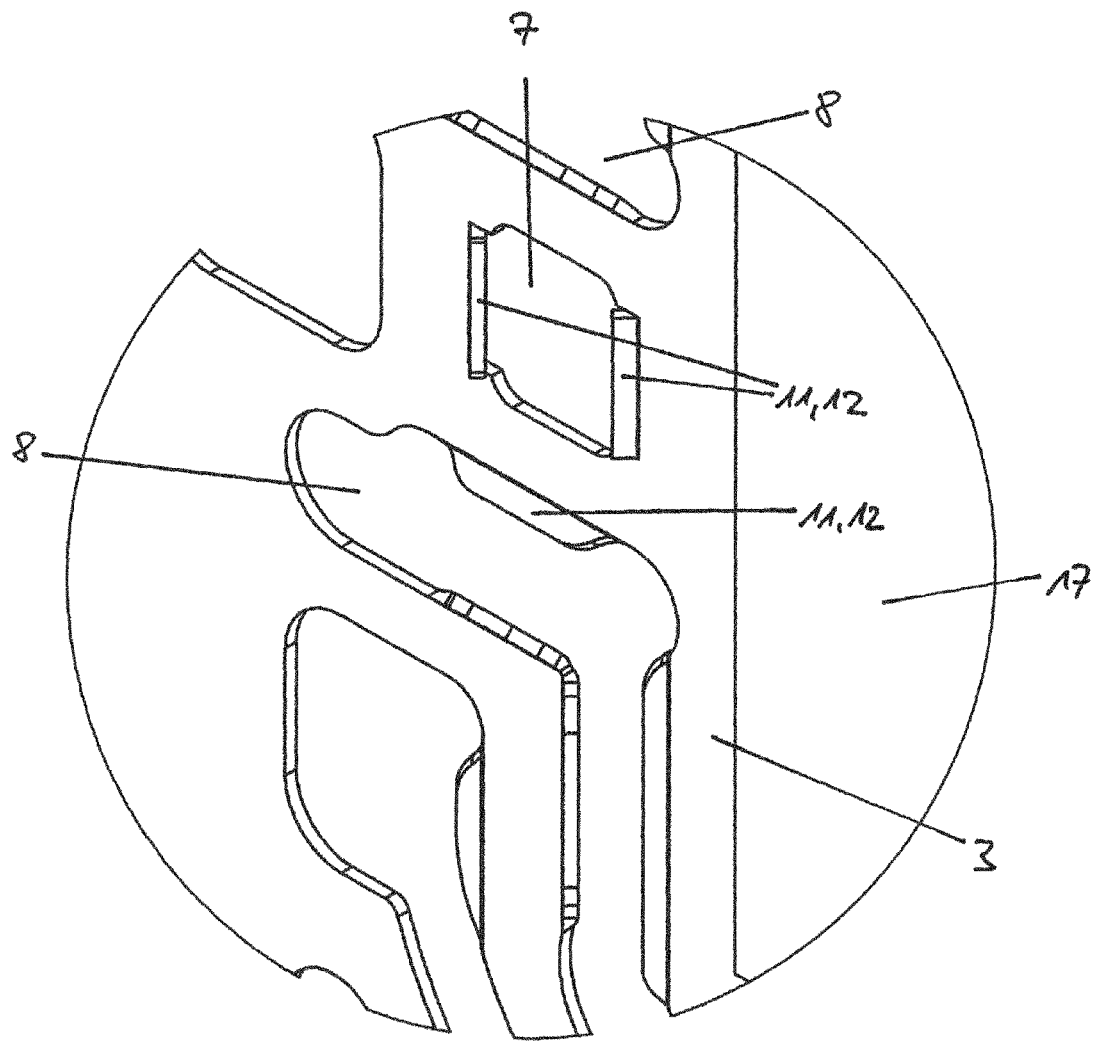
FIG. 8 shows a cut-out of the substrate according to FIG. 6.
Figure 9:
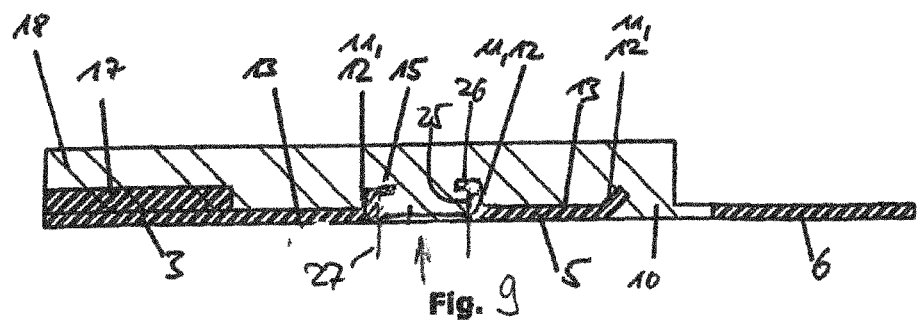
FIG. 9 shows a variant of an anchoring edge.

To this end the through-openings 7, 8, 9, 10 comprise anchoring edges 11 which interact with the casting compound during encapsulation of the semiconductor chips. The construction of the anchoring edges 11 is shown in FIGS. 3, 4 and 8. A variant with a profiled anchoring edge is shown in FIG. 9. As clearly revealed in FIGS. 3, 4 and 9, the anchoring edges 11 are formed by chamfering the surface sections 12 abutting the respective through-openings 7, 8, 9, 10.

Chamfering is understood to mean a reshaping of the foil (film), where the rim area of the foil limiting the respective through-opening 7, 8, 9, 10 is bent over. Specifically the adjacent surface section 12 is bent upwards/chamfered in such a way that the anchoring edge 11 protrudes past the side of the foil 1, on which the chip island 3 is arranged. The anchoring edge 11 protrudes somewhat beyond the surface of the surrounding foil 1. This arrangement can be clearly recognised in FIGS. 3, 4 and 9.

The chamfer angle between the chamfered surface section 12 and the further surface 13 of the foil 1 surrounding the chamfered surface section 12 is approx. 45° in FIGS. 3, 4 in the case of the non-profiled, i.e. flat anchoring edge. The chamfer angle may be in the range between 30° and 60°, in particular between 40° and 50°. In FIG. 4 the chamfer angle is denoted with the reference symbol a. The further surface 13 of the foil 1 extends in the horizontal in the views of FIGS. 3, 4. Relative to the further surface 13 of the foil 1, the chamfered surface section 12 is upwardly inclined/generally inclined.

The maximum chamfer angle of a profiled anchoring edge may be approx. 90°, as shown in FIG. 9. Here also an angle range is possible, wherein the lower limit may be e.g. 40° or 45° or larger.

The width of the chamfered surface section 12 is dimensioned such that a sufficient anchoring effect is achieved during encapsulation of the semiconductor chip 17 in the casting compound 18. As can be recognised in FIGS. 3, 4 the width of the chamfered surface section 12 may be roughly dimensioned such that the upper edge of the chamfered surface section 12 is arranged roughly at the height of the upper edge of the semiconductor chip 17 or slightly below it.

Figure 5:
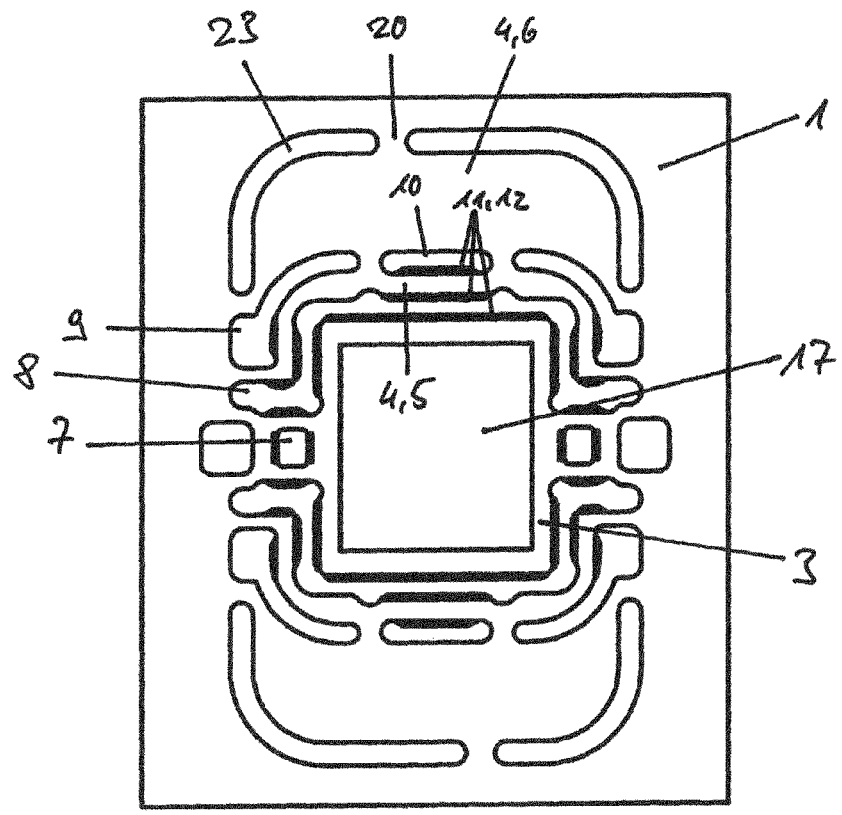
FIG. 5 shows a to view of a substrate according to an embodiment according to the invention with smooth anchoring edges without mould cap.

As can be clearly recognised in FIGS. 2 and 5, the chamfered surface sections 12 are straight, i.e. they are formed on straight sides of the through-openings. The chamfered surface sections 12 extend along the straight sides of the through-openings. Generally only straight sides of the through-openings are chamfered.

Surface sections which lie adjacent to curved areas of the through-openings, extend flush with the further surface 13 of the foil 1. That is, the curves 14 of the through-openings are chamfer-free. In other words the surface sections 14 in the curved areas, in particular in all curved areas, are not chamfered or bent over.

In addition, as can be seen in FIGS. 2 and 5, chamfer-free recesses 16 are formed at the corners of the second through-openings 8, which relieve mechanical stresses in the area of the chip island 3. The recesses 16 form roundings, which lie on the inside respectively, of the longitudinal shanks of the second through-openings 8 extending in longitudinal direction of the unit 2. In the exemplary embodiment shown in FIGS. 2 and 5 respective chamfer-free recesses 16 are provided at four corners of the second through-openings 8.

As can be clearly seen in FIGS. 2 to 4, the anchoring edges 11 are formed only in the area of the casting compound 18.

To stabilise the chip island 3 chamfered surface sections are formed on the insides 15 of the second through-openings 8. Due to this profiling of the foil the chip island 3 is stabilised. The curved areas of the insides 15 of the second through-openings 8 are chamfer-free.

As can be clearly recognised in FIGS. 2 and 5 chamfered surface sections 12/generally anchoring edges 11 are provided on the inside of the fourth through-opening 10. The anchoring edges 11 are formed in the straight areas of the inside of the third through-openings 9. The second through-openings 8 comprise respective anchoring edges 11/chamfered surface sections 12 both in the straight areas of the inside 15 and in the straight areas of the outside. The same applies to the first through-opening 7.

In contrast to the view in FIG. 2, where the semiconductor chip 17 is encapsulated, the semiconductor chip 17 in the view shown in FIG. 2 is exposed. In FIG. 5 the position of the anchoring edges can be clearly seen.

A further difference between the embodiments shown in FIG. 2 and FIG. 5 consists in that in FIG. 2 the anchoring edges 11 have a comb-like profile. The comb-like profile as per FIG. 2 extends in longitudinal direction of the anchoring edges 11. The chamfered surface sections 12 comprise a profiled outer edge. The profiled outer edge is formed by a plurality of uniform notches or cut-outs, which are arranged along the outer edge. The result is the comb-like profile. The notches shown are essentially rectangular. Other geometries are possible.

In the example in FIG. 5 the anchoring edges are smooth. They comprise a continuous straight outer edge. The outer edge is not interrupted as in FIG. 2. A combination of the examples as per FIGS. 2 and 5 is possible.

Figure 6:
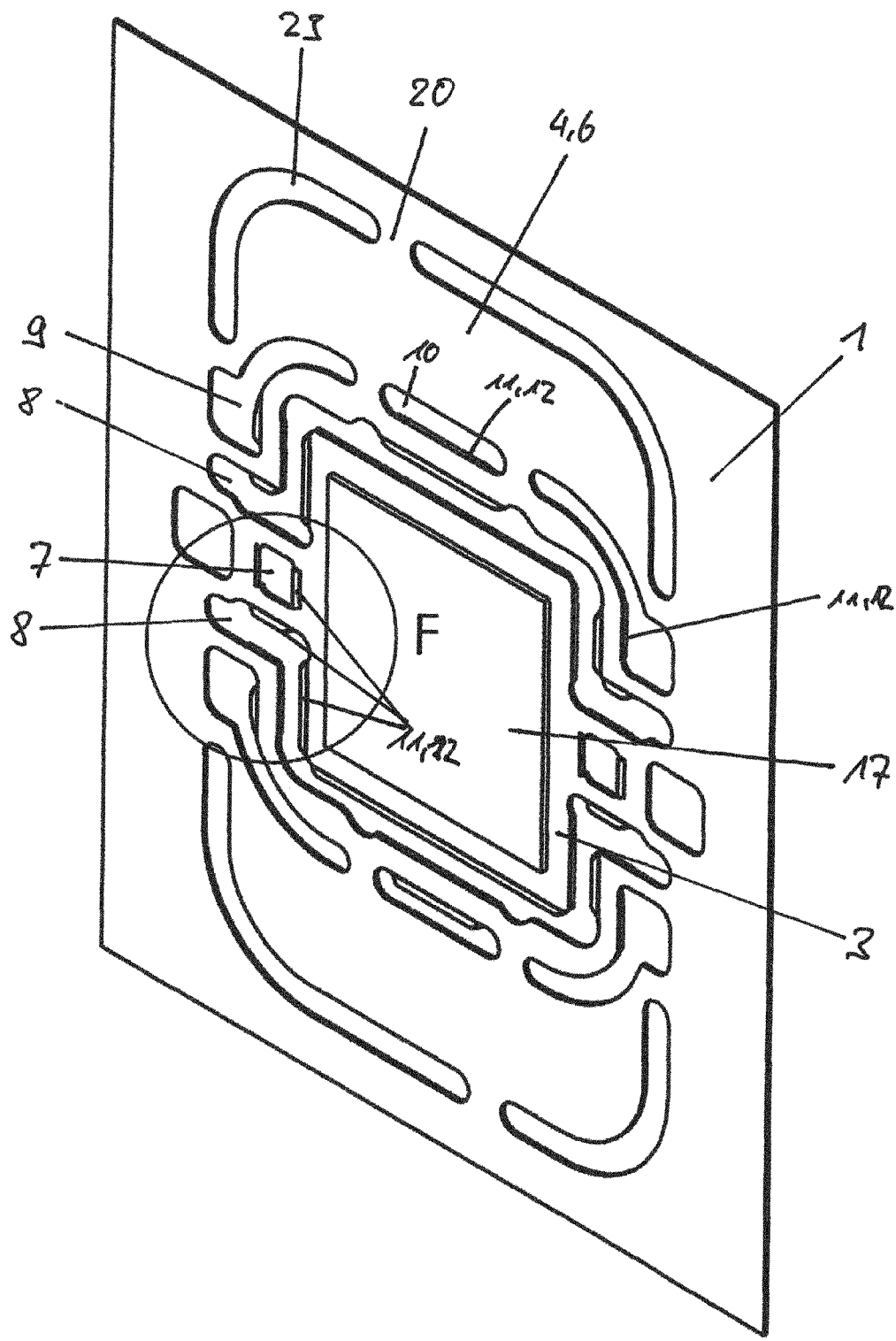
FIG. 6 shows a perspective view of the top of the substrate according to FIG. 5.
Figure 7:
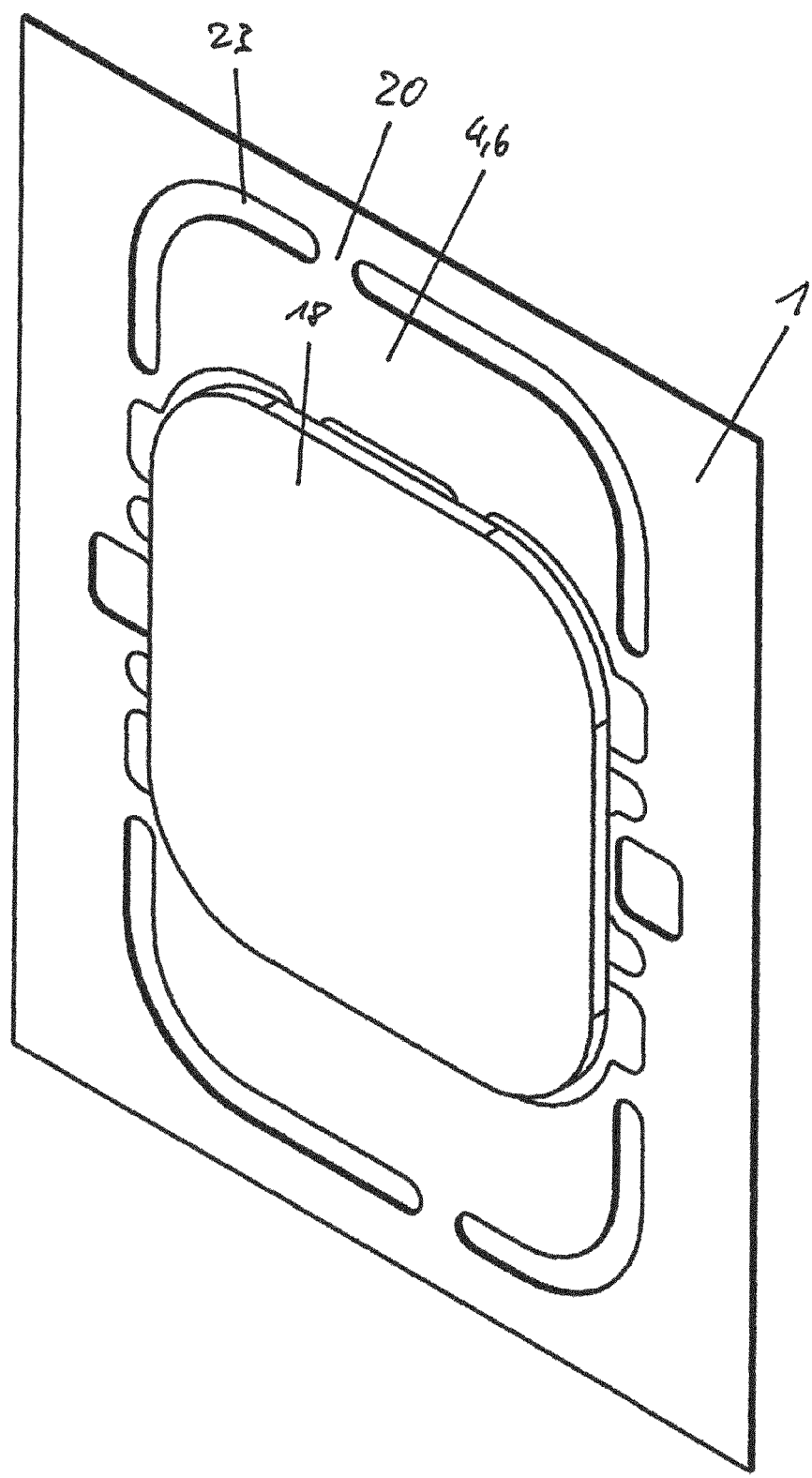
FIG. 7 shows a perspective view of the substrate according to FIG. 5 with semiconductor chip and mould cap.

FIG. 6 corresponds to the intermediate state as per FIG. 5. Due to the perspective view as per FIG. 6 the arrangement of the chamfered surface sections 12 can be clearly seen. In FIG. 7 the semiconductor chip as per FIG. 6 is cast into the casting compound 18, which forms a mould cap.

FIG. 8 shows a detailed cut-out from FIG. 6. Here the shape of the anchoring edges can be clearly recognised. The anchoring edges, as seen in the context of the first through-opening 7, may comprise flat faces. Other forms of anchoring edges 11 are possible, as depicted in the context of the second through-opening 8. Here it can be seen that the anchoring edge 11 has a curved face, which continually transitions into the inside 15 of the through-opening 8.

FIG. 9 shows a variant of the anchoring edge 11. The anchoring edge 11 is profiled transversely to the longitudinal extension of the anchoring edge 11. The chamfered surface section 12 comprises a first shank 25, which extends vertically to the further adjacent surface 13 of the foil, which is not bent over. The first shank 25 transitions into a second shank 26 which extends vertically to the first shank 26 and forms an outer edge of the chamfered surface section 12. This results in an L-shaped profile of the anchoring edge 11. If you add the further surface 13 of the foil, an overall Z-shaped profile results. The profile extends along the side of the respective through-opening. The profile extends along the side of the respective through-opening. The profile allows secure anchoring of the casting compound 18.

Other profiles are possible. Various profiles can be combined.

Manufacture involves a reshaping tool 27, as shown in FIG. 9. During the process the material is deep-drawn (set-down). The material thickness is reduced.

The foil used in the context of the embodiments is a metal foil consisting of a hard-rolled, austenitic stainless steel. The thickness of the foil is between 15 μm and 35 μm, specifically approx. 20 μm. As a result the overall thickness of the package/the electrical module can be reduced to 200 μm. Secure fixing of the casting compound 18 is achieved by the upwardly chamfered surface sections 12.

Manufacture of an electronic module using a carrier substrate as per FIGS. 2 to 8 is effected as follows: To start with a semiconductor chip 17 is placed on the top of the respective chip island 3 of each unit 2 and fixed there. The semiconductor chip 17 may for example be glued on. Subsequently the semiconductor chip 17 is connected via bond wires (not shown) to the bond pad 5. Then the semiconductor chip 17 and the bond wires are fixed in that a moulding compound or casting compound 18 such an epoxy resin, is applied. The casting compound flows underneath the chamfered surface sections 12, thereby embedding them. After hardening of the casting compound 18 this is firmly anchored in the substrate.

The structure devised in this way is shown in FIGS. 2 to 4 and 7.

Subsequently the structure is electronically punched out. This involves removing the webs 20, which mechanically connect the electrodes 4 to the remaining areas 19 in an electrically conductive manner. This relates to the webs 20 between the through-openings 23 and the webs 20 between the second and third through-openings 8, 9. The connecting webs between the third and fourth through-openings 9, 10 remain standing.

The webs 20 between the first and second through-openings 7, 8 cause the structure of the substrate to remain sufficiently stable and cohesive, enabling it to be processed further. Subsequently the functional test is carried out in order to remove defective modules.

Thereafter the modules are separated from the foil 1 in that the webs 20 between the first and second through-openings 7, 8 are removed. The electronic modules produced in this way can then be installed in that, for example, wires or conductor tracks are connected as antennas or electric power lines to the outer connection surfaces/antenna pads 6.

LIST OF REFERENCE SYMBOLS

1 film (metal foil)
2 unit
3 chip island
4 electrodes
5 bond pad
6 antenna pad
7 first through-openings
8 second through-openings
9 third through-openings
10 fourth through-openings
11 anchoring edge
12 chamfered (first) surface section
13 further surface of the film
14 (second) surface section
15 insides of the through-openings
16 chamfer-free recesses
17 semiconductor chip
18 casting compound
19 remaining areas
20 webs
21 conveying strip
22 conveying opening
23 through-openings without anchoring edges
24 connecting webs
25 first shank
26 second shank
27 reshaping tool

The invention claimed is:

1. A strip-shaped substrate, the substrate comprising:
a film;
a plurality of units disposed on the film, the plurality of units for producing chip carriers, each unit comprising
a chip island for fixing a semiconductor chip,
a plurality of electrodes for electrically connecting the semiconductor chip, and
a plurality of through-openings for structuring the respective unit, at least one through-opening forming an anchoring edge for a casting compound, the casting compound encapsulating the semiconductor chip; and
a surface section abutting the at least one through-opening of the film is chamfered for forming the anchoring edge;
wherein the anchoring edge protrudes beyond a side of the film on which the respective chip island is arranged;
wherein a thickness of the film is between 15 μm and 35 μm;
wherein the film is formed from austenitic stainless steel.

2. The substrate according to claim 1, wherein a chamfer angle between the surface section and a second surface of the film is between 30° and 60° or between 40° and 50°.

3. The substrate according to claim 1, wherein the surface section is straight.

4. The substrate according to claim 1, wherein the surface section comprises a comb-like profile for reducing a mechanical stress or the surface section comprises a smooth outer edge.

5. The substrate according to claim 1, wherein a through-opening of the plurality of through-openings comprises a chamfer-free curve or a chamfer-free recess for reducing a mechanical stress.

6. The substrate according to claim 1, wherein a through-opening of the plurality of through-openings abutting the chip island comprises an anchoring edge or the through-opening of the plurality of through-openings abutting the chip island on an inside of the chip island comprises the anchoring edge.

7. An electronic module comprising:
a chip carrier comprising a chip island and a semiconductor chip fixed on the chip island;
a plurality of electrodes for electrically connecting the semiconductor chip;
a plurality of through-openings for structuring the chip carrier, at least one through-opening forming an anchoring edge for a casting compound, the casting compound encapsulating the semiconductor chip; and
a surface section of the chip carrier abutting the at least one through-opening is chamfered for forming the anchoring edge;
wherein the anchoring edge protrudes beyond a side of the chip carrier on which the chip island is arranged;
wherein a thickness of the chip carrier is between 15 μm and 35 μm;
wherein the chip carrier is formed from austenitic stainless steel,
wherein the anchoring edge is embedded in the casting compound.

8. An electronic device comprising,
an electronic module of claim 7,
wherein the chip carrier is formed as chip card, health card, bank card, public transport ticket, hotel card, identity document, passport, paper-foil-type card, or an admission card.

9. A method for preparing a strip-shaped substrate to be manufactured into an electrical module,
the substrate comprising a film and a plurality of chip carriers disposed on the film, each chip carrier comprising a chip island and a semiconductor chip fixed on the chip island; a thickness of the film is between 15 μm and 35 μm and the film is formed from austenitic stainless steel;
the method comprising:
(a) punching a plurality of through-openings in the film; and
(b) chamfering a surface section of the chip carrier to form an anchoring edge for a casting compound.

10. A strip-shaped substrate comprising:
a metal foil comprising a plurality of units disposed on the foil the plurality of units for producing chip carriers, each unit comprising
a chip island for fixing a semiconductor chip;
a plurality of electrodes for electrically connecting the semiconductor chip; and
a plurality of through-openings for structuring the respective unit, at least one through-opening forming an anchoring edge for a casting compound, the casting compound encapsulating the semiconductor chip;
wherein the metal foil, the metal foil is comprises an austenitic stainless steel;

wherein the metal foil comprises a thickness between 15 µm and 35 µm;

wherein the metal foil is formed from austenitic stainless steel.

11. The electronic module of claim 7, wherein at least one electrode of the plurality of electrodes is a bond wire.

12. The substrate of claim 1, further comprising the casting compound.

13. The substrate of claim 10, further comprising the casting compound.

* * * * *